United States Patent [19]

Mayer

[11] Patent Number: 4,461,567

[45] Date of Patent: Jul. 24, 1984

[54] METHOD OF AND APPARATUS FOR THE POSITIONING OF DISK-SHAPED WORKPIECES, PARTICULARLY SEMICONDUCTOR WAFERS

[75] Inventor: Herbert E. Mayer, Eschen, Liechtenstein

[73] Assignee: Censor Patent- und Versuchs-Anstalt, Vaduz, Liechtenstein

[21] Appl. No.: 426,111

[22] Filed: Sep. 28, 1982

Related U.S. Application Data

[63] Continuation-in-part of Ser. No. 220,451, Dec. 29, 1980, Pat. No. 4,376,581, which is a continuation-in-part of Ser. No. 188,539, Sep. 18, 1980, abandoned.

[51] Int. Cl.³ .............................................. G03B 27/52
[52] U.S. Cl. ...................................... 355/41; 355/125
[58] Field of Search ........................ 355/40, 41, 43, 63, 355/73, 125; 250/557, 561

[56] References Cited

U.S. PATENT DOCUMENTS

| | | | |
|---|---|---|---|
| 3,771,872 | 11/1973 | Nightingale et al. | 355/125 |
| 3,816,223 | 6/1974 | Ahn et al. | 355/125 X |
| 3,844,655 | 10/1974 | Johannsmeier | 355/43 |
| 3,930,684 | 1/1976 | Lasch, Jr. et al. | 355/73 X |
| 4,295,735 | 10/1981 | Lacombat et al. | 355/63 X |
| 4,376,581 | 3/1983 | Mayer | 355/41 X |
| 4,405,229 | 9/1983 | Mayer | 355/125 X |

Primary Examiner—Richard A. Wintercorn
Attorney, Agent, or Firm—Karl F. Ross; Herbert Dubno

[57] ABSTRACT

In the photoexposure of semiconductor wafers for the production of circuit elements, the wafers are placed in a prealignment position before being transferred to the exposure stage. A chuck acting as a prepositioning stage is rotatable by one servomotor to set the wafer in its appropriate angular position ($\phi$ adjustment) and is shiftable by respective servomotors in the X and Y directions. Servomotor control is effected by optical means detecting a noncircular edge portion of the wafer as well as alignment marks on the wafer inwardly of the edge thereof.

6 Claims, 9 Drawing Figures

METHOD OF AND APPARATUS FOR THE POSITIONING OF DISK-SHAPED WORKPIECES, PARTICULARLY SEMICONDUCTOR WAFERS

CROSS REFERENCE TO RELATED APPLICATION

This application is a continuation-in-part of my copending application Ser. No. 220,451 filed Dec. 29, 1980 now U.S. Pat. No. 4,376,581, issued Mar. 15, 1983, as a continuation-in-part of an earlier application, Ser. No. 188,539, filed Sept. 18, 1980 and now abandoned.

FIELD OF THE INVENTION

My present invention relates to a method of and to an apparatus for the proper orientation of planar workpieces, especially disk-shaped members such as semiconductor wafers, on which a pattern of circuit elements is to be formed at predetermined locations by selective illumination of a photosensitive layer thereon in an exposure station to which they are transferred after a coarse preliminary alignment in a prepositioning station.

BACKGROUND OF THE INVENTION

In the production of such circuit elements, workpieces in the form of semiconductor wafers coated with a photosensitive layer are illuminated through a mask by an appropriate optical system, usually with substantial image-scale reduction, so that subsequent development and chemical treatment may establish an array of conductive and nonconductive areas on the wafer surface.

In many cases, a given wafer must be subjected to several such exposures with intervening processing requiring removal from its support. Thus, correlation or cross-matching of the wafer positions during all exposure operations is essential. Such precise positioning in the exposure station requires the photoelectric detection of very fine indexing marks on the wafer surface by highly sensitive optoelectronic means whose field capture is generally extremely limited so that the wafer must arrive at that exposure station with a preliminary orientation designed to ensure that the indexing marks will lie within the window of detection of the adjustment means. This prealignment is advantageously done in a prepositioning station at the same time that another wafer undergoes illumination in the associated exposure station. The use of the same indexing marks in the prepositioning station for prealignment purposes, however, would require a duplication of the high-precision photoelectric detection equipment and would be economically unjustified inasmuch as the subsequent transfer to the exposure station introduces some unavoidable departures from the pre-established orientation of the semiconductive wafer.

Conventionally, therefore, the preadjustment is effected by less sensitive photoelectric means designed to detect a distinctive configuration such as a flat edge portion on the outer contour of the wafer; see, for example, U.S. Pat. No. 3,930,684. Since, however, the location of the indexing marks bears a definite relationship only with circuit array formed or to be formed but not with the periphery of the wafer, such a system is not entirely satisfactory in situations requiring cross-matching between successively produced patterns.

OBJECT OF THE INVENTION

Thus, the object of my present invention is to provide a more effective method of and apparatus for the orientation of a semiconductor wafer in a prepositioning station and in an associated exposure station.

SUMMARY OF THE INVENTION

This object and others which will become apparent hereinafter are attained, in accordance with the present invention, by providing each wafer inwardly of its outer periphery but yet close to the edge thereof with at least one, but preferably two spaced-apart alignment marks with respect to which an optoelectronic sensor is responsive and by providing the prepositioning station with a stage displaceable in X, Y and $\phi$ coordinate directions by respective servomotors responsive to the optoelectronic sensor.

The table or stage can be rotatable about an axis perpendicular to the X - Y plane and disposed at the origin of the X and Y coordinate systems, e.g. by means of a worm and worm wheel arrangement while the worm and other rotary members of the table can be mounted, in turn, on stacked table members or carriages shiftable respectively in the X and Y directions, i.e., two mutually perpendicular horizontal directions.

The system of the present invention can operate utilizing the principles of the aforementioned copending application as well, e.g. by providing a magazine in which the semiconductive wafers (usually provided with photosensitive layers) are stored and from which the wafers can be withdrawn successively by a manipulator which transfers them to the prepositioning station and whereafter the wafers are transferred to the printing or exposure station. The manipulator and magazine of that application, which is hereby incorporated in its entirety by reference, may be utilized in the present system as well.

One of the advantages of the system of the present invention is that, upon transfer of the wafer in its orientation as established in the prepositioning station, to the exposure station, any additional adjustment which is required at the latter can be effected exclusively by X - Y adjustment. Yet another advantage of this system is that any required angular adjustment of the exposure mask (see the aforementioned application) can be of extremely small magnitude.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
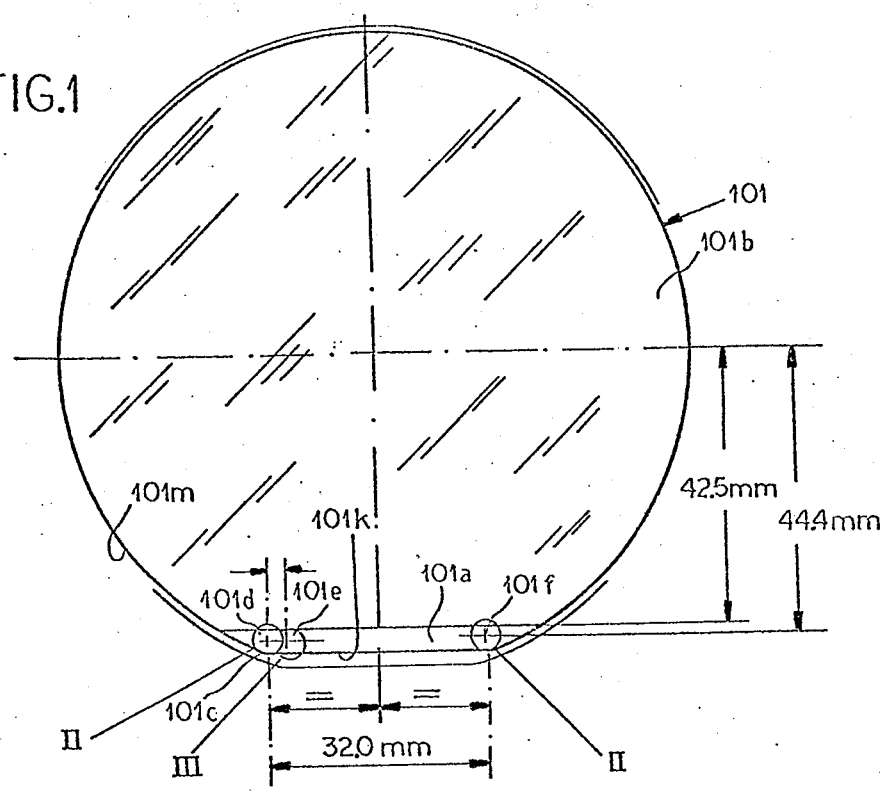
FIG. 1 is a plan view of a wafer, according to the invention, which can be photoexposed in accordance with a pattern determined by a mask.
Figure 2:
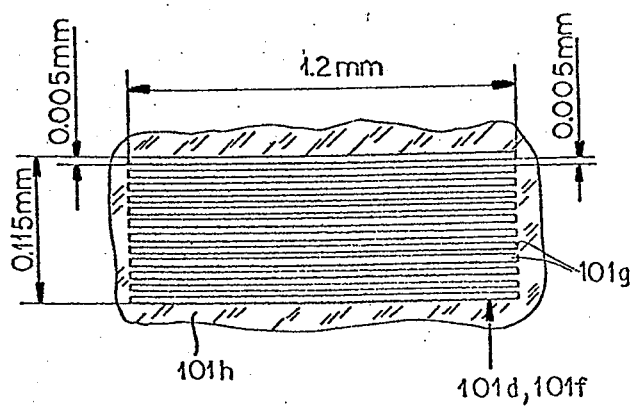
FIG. 2 is an elevational view, greatly enlarged of the regions II of the wafer of FIG. 1.
Figure 3:
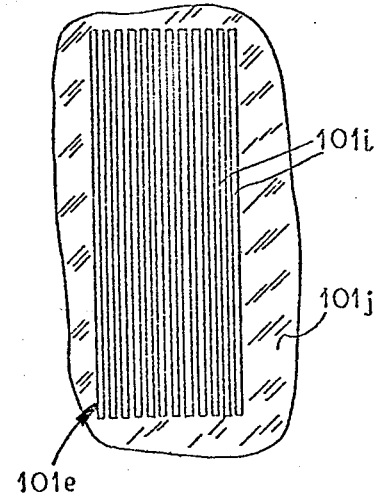
FIG. 3 is a greatly enlarged view of the region III of the wafer of FIG. 1.

FIGS. 1 through 3 illustrate a wafer of the type which can serve as a workpiece according to the present invention. The wafer 101 comprises a silicon disk 101a of the dimensions, given in millimeters, shown in the drawing and provided over substantially its entire surface with a layer 101b of photosensitive material which can be exposed for generating patterns, e.g. of conductors, upon this semiconductor wafer which can be assumed to have been previously treated to form circuit elements by electron beam technology or previous photoexposure treatments.

In an edge portion 101c of the wafer, which is translucent, there are provided alignment marks 101d, 101e and 101f which have been shown in greater detail in FIGS. 2 and 3. The alignment marks 101d and 101f are each constituted by narrow translucent strips 101g in a dark or opaque field 101h, the strips extending in the Y-direction of adjustment.

The mark 101e shown in FIG. 3, comprises an array of narrow translucent strips 101i extending in the X-direction of adjustment, i.e. perpendicular to the strips 101g, and also in a dark or opaque field 101j. The marks 101d–101f may be applied at the same time as any previous circuit elements are applied to the wafer so that the positions of these marks are precisely coordinated with the positions of these circuit elements and the marks can serve to enable the wafer to be lined up for precise exposure of the mask pattern relative to preexisting circuit elements.

Figure 4:
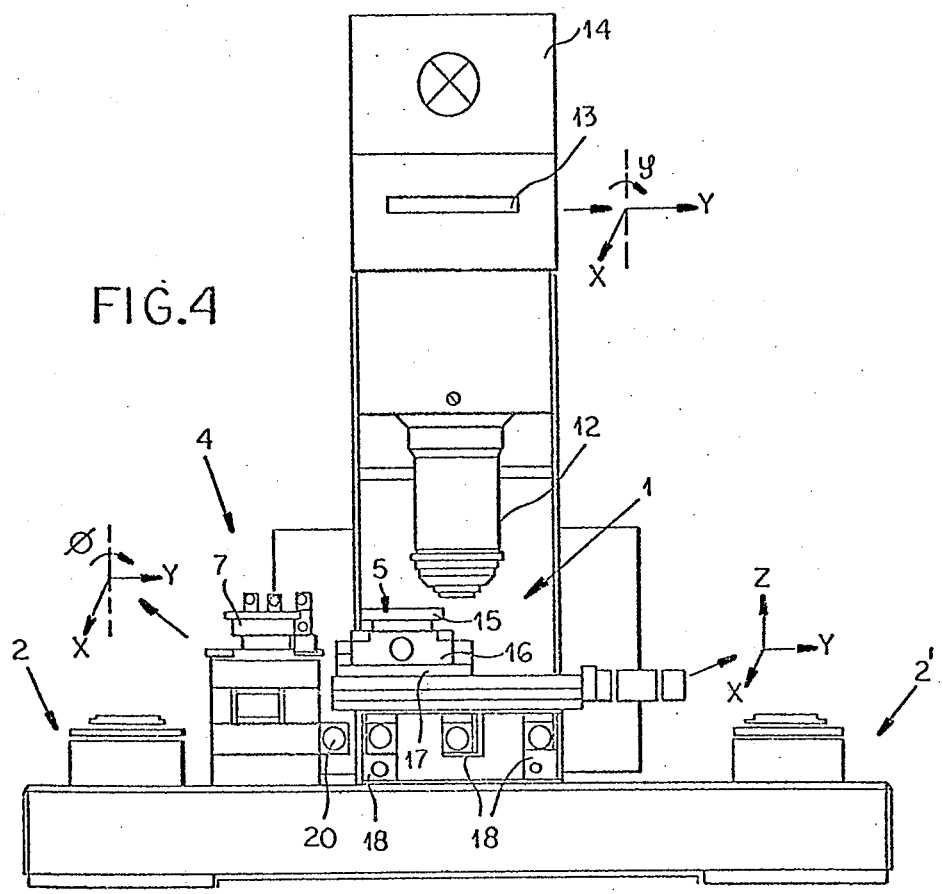
FIG. 4 is a vertical elevational view diagrammatically illustrating an apparatus according to the present invention for printing the patterns of a mask, greatly reduced in size, by the step-and-repeat method on wafers of the type shown in FIGS. 1 through 3, this view omitting the manipulator arm so that other parts can be seen more clearly.
Figure 5:
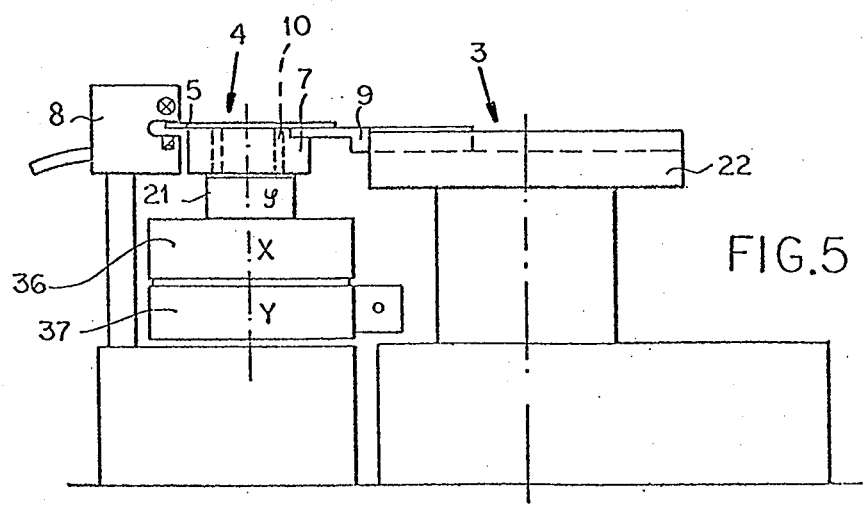
FIG. 5 is an elevational view of a prepositioning station shown in greater detail in FIGS. 7 and 8 and diagrammatically illustrating an aspect of the invention, i.e. how the prepositioning station can cooperate with the exposure or printing station.
Figure 6:
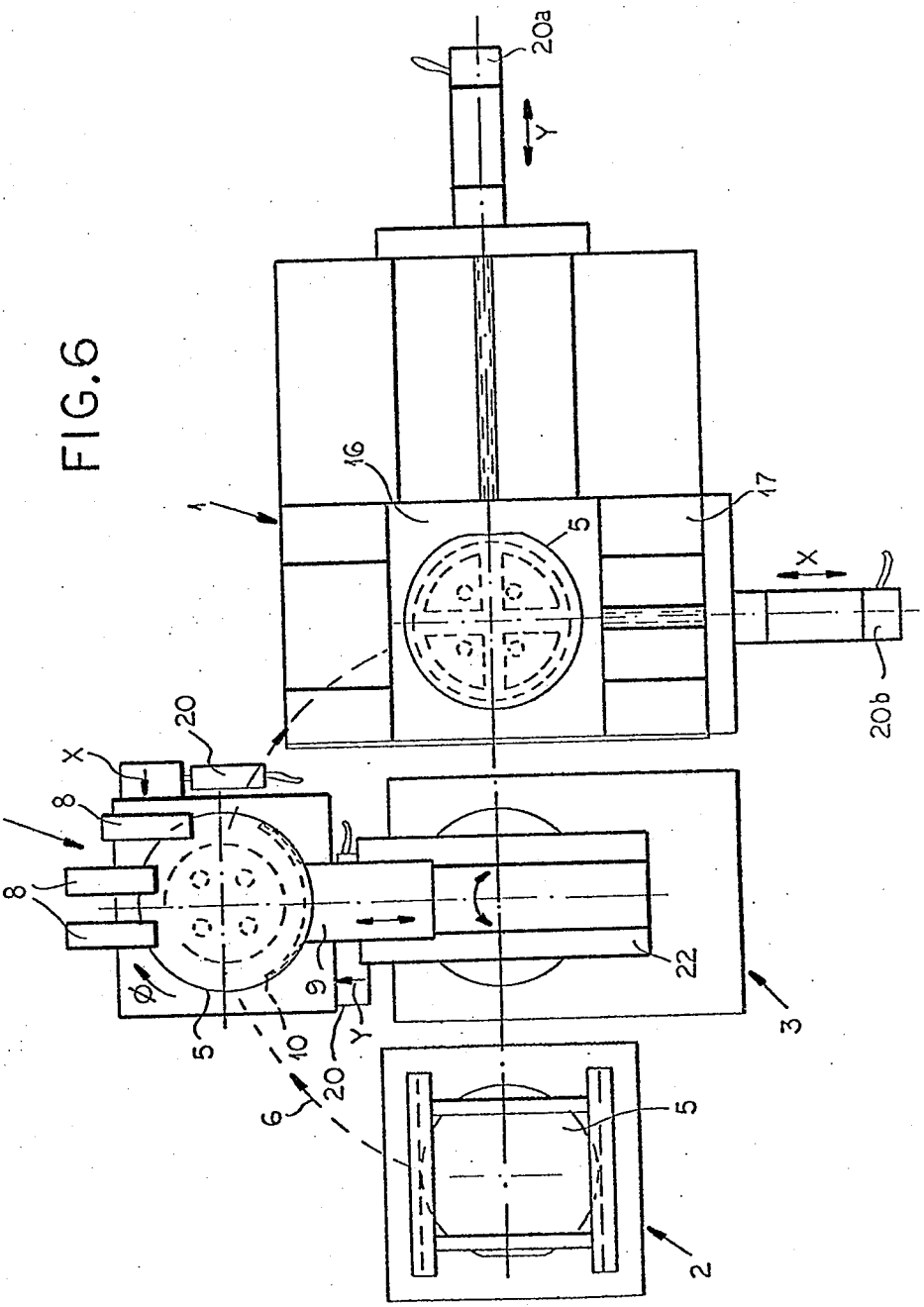
FIG. 6 is a plan view of the system of FIG. 4.

FIGS. 4 through 6 show the overall arrangement of an apparatus for exposing such wafers, the apparatus comprising at least one magazine 2 in which the wafers, previously provided with unexposed photosensitive layers, are stacked and from which the wafers can be successively removed by a manipulator 3 and set to a prepositioning station 4.

The details of the latter, as far as they involve the actual manipulation of the wafer to position it in accordance with a fixed reference such as a raster or grid, have beein illustrated in FIGS. 7 and 8 will be described in connection with these FIGURES.

At this point it is sufficient to note that in the manipulator, the wafer is positioned with respect to the reference in the X and Y-directions and angularly as represented by the displacement $\phi$. The angular displacement $\phi$ of the wafer in its plane and hence in the Y plane, naturally is effected about an axis parallel to the Z coordinate axis.

Thereafter, the oriented and positioned wafer is shifted into the printing station 1 and disposed and chucked on a stage 15 on which it is held by the application of suction from below.

The stage 15 is mounted on two carriages 16 and 17 movable in the X and Y coordinate directions respectively, and also displaceable in the Z coordinate direction, i.e. vertically, by respective stepping motors 18.

A projection lens is mounted above the stage 15 to project an image, reduced in size 10:1, from the mask 13 onto the wafer. The light source and exposure opitcs are represented by the projection lens 12 and the lamp assembly 14.

The exposure is carried out by the step-and-repeat method, i.e. the image of the mask is focused on a part of the wafer which is exposed, whereupon the wafer is stepped through a predetermined increment in the X and/or Y-direction and exposure is repeated until the entire wafer has been swept by the exposure sequence.

The means for stepping the stage 15 and triggering the exposure are conventional in the art and have not been illustrated in detail.

After the exposure is complete, the exposed wafer is transferred to and stored in a magazine 2'.

As can be seen from FIG. 5, the manipulator 3 has a pivoting arm 22 carrying a radially shiftable fork-shaped retaining member 9 which can engage beneath the wafer and is provided with section holes 10 at which reduced pressure is generated to grip the wafer.

In the prepositioning station 4, moreover, the stage is provided with holes at which suction is generated so that the wafer can be retained when it is not about to be transferred by the arm 22.

The stage 7 is rotatable by means generally represented at 21 and including a motor, about the vertical axis to effect the angular displacement $\phi$. The table is also carried upon a pair of stacked carriages 36, 37 shiftable in the X and Y-directions. The sensor assembly for the positioning of the wafer is represented generally at 8 and, as will be described in greater detail hereinafter, controls the means for effecting X, Y and $\phi$ displacement.

Referring now to FIG. 6, it can be seen that the manipulator 3 withdraws an unexposed wafer 5, e.g. of the type shown at 101 in FIGS. 1 through 3, from the magazine 2 and disposes it on the stage or table 7 of the prepositioning stage 4.

This table 7 is then displaced in the X, Y and $\phi$ directions until the wafer is in a predetermined position relative to a stationary system of coordinates.

Whereas in the aforementioned copending application, the sensors responded to the cordal edge 101k and its relationship to the arcuate periphery 101m of the wafer, the system of the instant invention can utilize at least in part detection of the reference marks 101d through 101f.

After this coarse adjustment, crescent-shaped member 9 of arm 22 engages the wafer from beneath and shifts it inot the printing station 1 where the wafer is disposed on stage 15 and held by reduced pressure. The wafer is thus in a position in which the reference marks 101d through 101f lie within the field of view or capture region of the optoelectronic means controlling the fne alignment whereupon exposure can be carried out in the manner described and in a stepwise operation utilizing the stepping motors 18. The means for fine alignment in the printing station has not been disclosed in detail since it is not the subject matter of this invention although similar means can be used as are employed for the positioning of the wafers at station 4.

During this fine alignment and the subsequent exposure provess, the manipulator 3 can carry a further wafer onto table 7 and is prepared to remove a wafer from the printing station to carry it into the magazine 2'.

Figure 7:
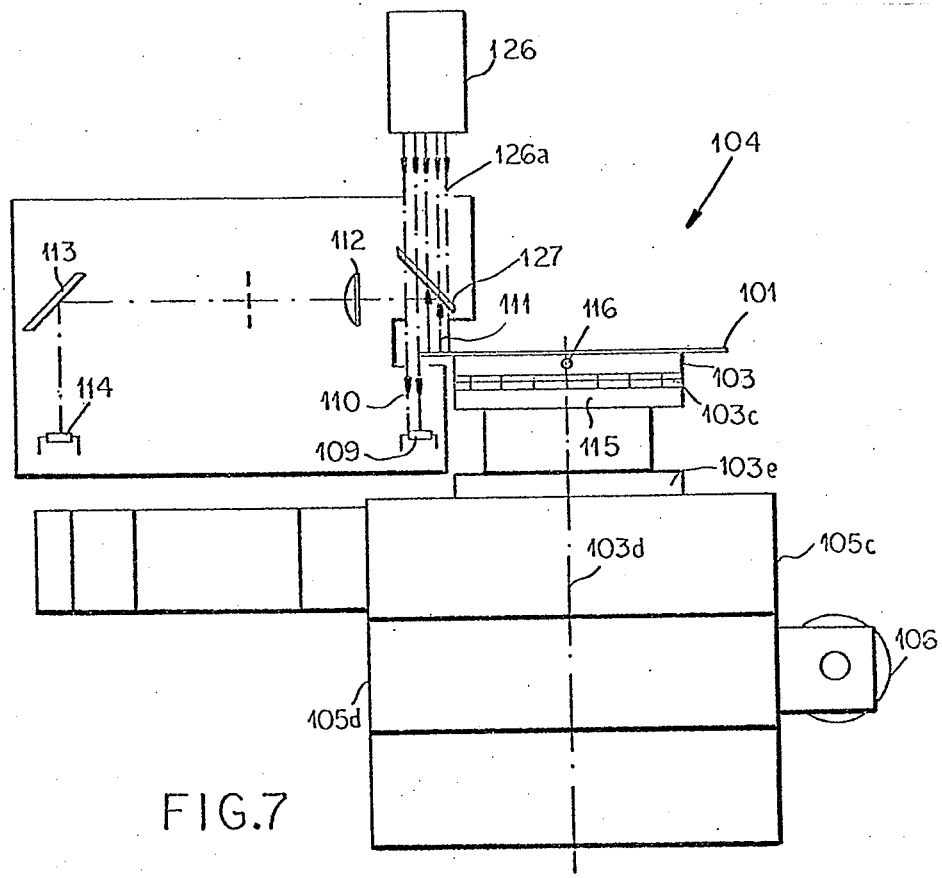
FIG. 7 is an elevational view of the prepositioning station according to the instant invention.
Figure 8:
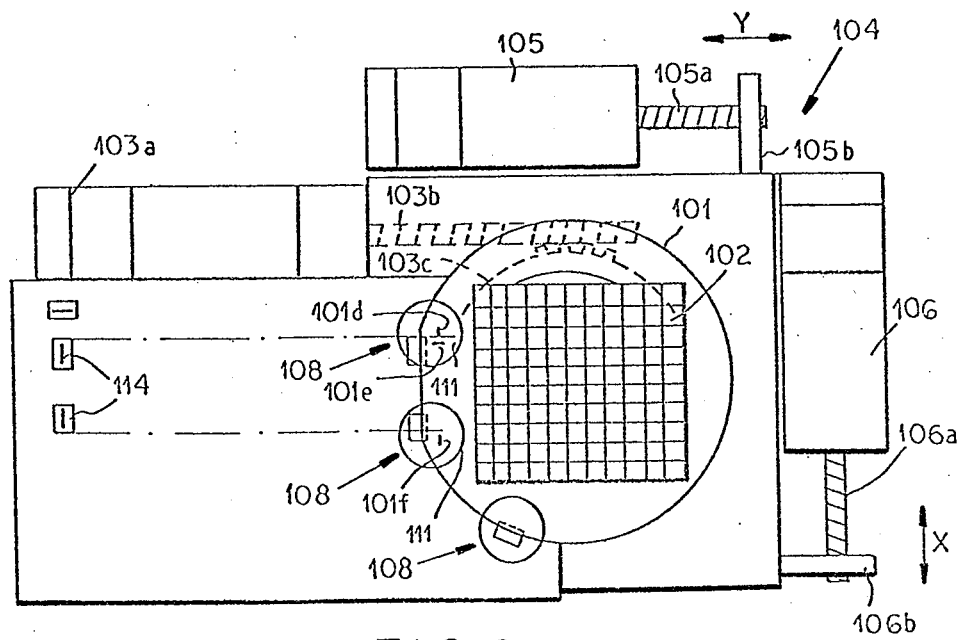
FIG. 8 is a plan view thereof.

The prepositioning station 104 shown in FIGS. 7 and 8 can, of course, be used as the station 4 previously described.

The wafer 101 bearing a pattern 102 is carried by the swinging arm onto the suction chuck or table 103 which is rotated by a servomotor 103a whose worm 103b meshes with a worm wheel 103c coupled with the chuck 103 so that the latter can be rotated about the axis 103d through the angle φ.

The chuck is journaled on a carriage 103e which can be shifted by a lead screw 105a driven by a servomotor 105 and threaded into an arm 105b connected to the carriage.

The carriage can move on rails on a table 1105c which is guided on tracks (not shown) on a further table 105d so that another lead screw 106a driven by motor 106 and threaded into the bracket 106b can displace this member 105c. Thus the motors 105 and 106 define the X and Y-directions of the displacement.

The sensor system comprises three optical units represented generally at 108 and which can cooperate with marks on the wafer or with the edges previously mentioned. For the purposes of this description, the sensors will be understood to cooperate with the cordal and arcuate edges of the wafer.

Each optical system comprises a light source 126 directing a columnar beam 126a of light downwardly through a semitransparent mirror 127 across the edge of the wafer 101 which overhangs the chuck 103, and toward a photodiode 109 therebelow.

The photodiode does not collect the portion of the light beam which is obstructed by the edge of the wafer so that the electrical value of the photodiode is a function of the degree to whic it is overhung by the wafer edge. The portion of the beam which does impinge upon the photodiode is represented at 110.

The electrical value is registered by conventional circuitry while a full rotation is imparted to the chuck 103, i.e. a command signal is given to the motor 103a to rotate the chuck for this full revolution or until the wafer is in the appropriate angular position as determined by the fact that all three photodiodes 109 are shielded to the predetermined desired extent.

In these positions, the beams 111 are also trained upon th emarsk 101d, 101e and 101f which are used for the more exact positioning. The images of these marks are transmitted by the semireflective mirror 127 through the condensing or objecting lens 112 and the mirror 113 to respective differential photodiodes 114 which control the motors 105, 106, and if necessary the motor 104, for more precise positioning of the wafer.

The principle of this diode-controlled adjustment is described in connection with FIG. 9.

The wafer 101 is displacd in the X, Y and φ coordinates until it has been properly positioned and is then transferred to the projection table, capable of XY displacement and with the marks 101d through 101f utilized for fine positioning in the projection station.

A Peltier-effect heating and cooling device 115 is provided to control the temperature of the table in response to a temperature sensor 116 so that the temperature of the wafer and of the table wilkl be the same as the temperature of the table upon which the wafer is subsequently placed.

Figure 9:
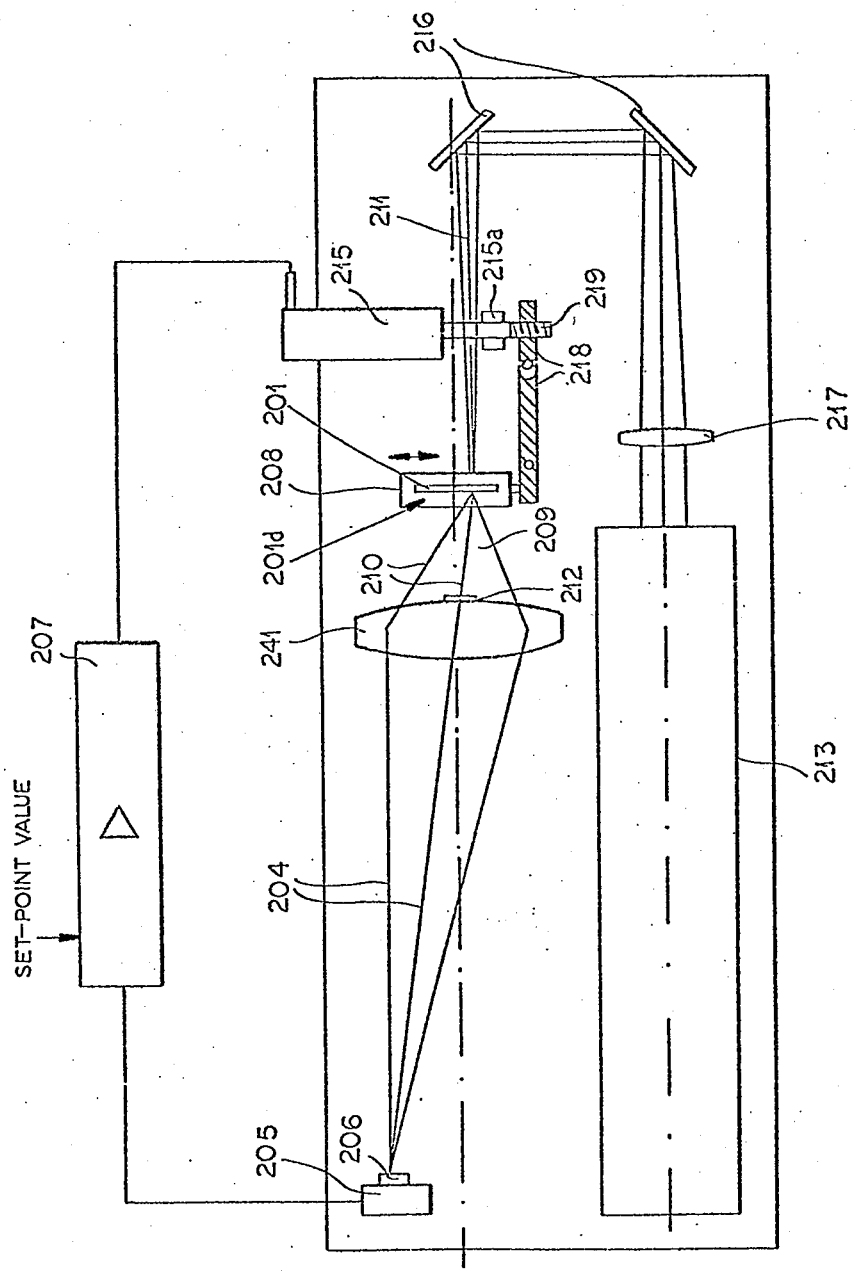
FIG. 9 is a diagram illustrating the operation of an optoelectronic means for adjusting the position of a workpiece, the principles of which are utilized in the system of FIGS. 7 and 8.

FIG. 9 has been presented to show the principles of differential diode adjustment of the type used in the present invention.

The optical source is a laser 213 which projects its coherent light bundle through a collective lens 217 which focuses it upon one of the two marks 201d of the wafer 201, here, for convenience of explanation and illustration, being shown to be vertically positioned. The coherent light beam 211 is trained on the marks by mirrors 216 which can represent any means for directing the beam onto the marks.

In the region of the marks, the wafer can be translucent so that transmitted light is utilized for positioning. However, as in the embodiment of FIGS. 7 and 8, light reflected from the marks will also serve.

The wafer is held in a device which is here represented at 208 and can be displaced via the lever 218 by a motor 215 and a leadscrew 215a.

The transmitted (or reflected) light from the marks is collected by an optical system represented by the collecting lens 241 which focuses the beam 204 to a differential photodiode 206.

The laser light bundle trained upon the marks 201d and focused on the surface of the collecting lens is absorbed by a shield 212. Thus only the portions of the beam defracted by the marks 201d are projected onto the diode 206.

As previously noted, the marks 201d, etc., are in the form of a light-scattering open structure.

Since the light scattered by the marks is collected and focused upon the photoelectronic element 206, a comparatively sharp image of the mark can be formed thereon and the total received light will be a function of the position of the wafer. The amplifier 205 feeds the signal to a comparator 207 which also receives a set point value establishing the precise position of the wafer, the difference signal being an electrical output proportional to the deviation between the actual position and the set point position. This difference signal is supplied to the motor 215 to properly shift the wafer.

It will be understood that a system analogous to that shown in FIG. 9, whether using direct transmission of light or reflected light as is the case in the embodiment illustrated in FIGS. 8 and 9, can be used to control each of the servomotors 103a, 105, 106.

I claim:

1. A method of preparing a semiconductor wafer for the formation of a pattern of circuit elements at predetermined locations on a surface thereof by selective illumination of a photosensitive layer on such surface through a mask in an exposure station after orthogonal and angular prealignment of the wafer in a prepositioning station, comprising the steps of:
(a) providing the wafer with a peripheral edge having a distinctive portion and with a relatively wide surface marking and a multiplicity of relatively narrow optical surface markings inwardly from said edge;
(b) coarsely prealigning the wafer in the prepositioning station by optical detection of said distinctive edge portion and of said relatively wide surface marking;
(c) transferring the wafer to the exposure station with the orientation imparted thereto in the prepositioning station; and (d) more precisely adjusting the wafer in said exposure station by optically detecting said relatively narrow surface markings.

2. The method defined in claim 1 wherein said relatively wide surface marking comprises two sets of closely juxtaposed parallel lines at spaced-apart locations, the lines of one set being perpendicular to those of the other.

3. The method defined in claim 1 wherein said relatively wide surface marking is of light-scattering character.

4. The method defined in claim 3 wherein said relatively wide surface marking is disposed on a light-transmissive area transluminated by a position-detecting beam.

5. The method defined in claim 1, 2, 3 or 4 wherein light is directed upon said relatively wide surface marking from a laser.

6. In an apparatus for preparing semiconductor wafers for the formation of a pattern of circuit elements at predetermined locations on a surface thereof, including a prepositioning station with a first wafer-supporting chuck, first photoelectric sensing means in said prepositioning station for detecting the orientation of a wafer carried on said first chuck, first drive means coupled with said first chuck and controlled by said first sensing means for imparting a predetermined orthogonal and angular prealignment position to such wafer, an exposure station with a second wafer-supporting chuck, second photoelectric sensing means in said exposure station for detecting narrow alignment marks on a wafer carried on said second chuck, transport means engageable with the so oriented wafer for transferring same in said prealignment position from said first to said second chuck, projection means in said exposure station trained upon said second chuck for selectively illuminating a photosensitive surface layer of a wafer on said second chuck through a mask conforming to the pattern of circuit elements to be produced, and second drive means coupled with said second chuck for precisely aligning the wafer to be illuminated with said mask under the control of said second sensing means, the improvement wherein said first sensing means comprises a plurality of contour-scanning photodetectors responsive to a noncircular edge portion of a wafer carried on said first chuck and at least one surface-scanning photodetector responsive to at least one indexing mark substantially wider than and spaced from said alignment marks on the wafer surface, said surface-scanning photodetector emitting a corrective signal supplementing an output signal of said contour-scanning photodetectors in the control of said first drive means.

* * * * *

Dedication

4,461,567.—*Herbert E. Mayer*, Eschen, Liechtenstein. METHOD OF AND APPARATUS FOR THE POSITIONING OF DISK-SHAPED WORKPIECES, PARTICULARLY SEMICONDUCTOR WAFERS. Patent dated July 24, 1984. Dedication filed Feb. 20, 1990, by the assignee, Mercotrust Aktiengesellschaft.

Hereby dedicates to the Public the remaining term of said patent.
[ *Official Gazette April 17, 1990* ]